United States Patent
Takahashi et al.

(10) Patent No.: US 8,227,323 B2
(45) Date of Patent: Jul. 24, 2012

(54) METHOD FOR MANUFACTURING SEMICONDUCTOR DEVICE

(75) Inventors: Kouta Takahashi, Nagano (JP); Takeshi Fujii, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/815,944

(22) Filed: Jun. 15, 2010

(65) Prior Publication Data

US 2010/0323499 A1   Dec. 23, 2010

(30) Foreign Application Priority Data

Jun. 18, 2009   (JP) ................................. 2009-145552

(51) Int. Cl.
*H01L 21/768* (2006.01)

(52) U.S. Cl. . 438/478; 438/653; 438/666; 257/E21.002; 257/E21.584; 257/E21.585

(58) Field of Classification Search .......... 438/478, 438/653, 666; 257/E21.002, E21.584, E21.585
See application file for complete search history.

(56) References Cited

U.S. PATENT DOCUMENTS

| | | | | |
|---|---|---|---|---|
| 4,352,724 A * | 10/1982 | Sugishima et al. | ...... | 204/192.37 |
| 4,999,096 A | 3/1991 | Nihei et al. | | |
| 5,210,053 A * | 5/1993 | Yamagata | ..................... | 438/620 |
| 5,730,835 A | 3/1998 | Roberts et al. | | |
| 6,057,234 A | 5/2000 | Yamazaki | | |
| 6,949,464 B1 * | 9/2005 | Doan | .................. | 438/688 |
| 2003/0094643 A1 * | 5/2003 | Yang | ................ | 257/296 |
| 2004/0241980 A1 * | 12/2004 | Yamazaki et al. | ............ | 438/632 |
| 2008/0001232 A1 * | 1/2008 | Lee et al. | ...................... | 257/368 |
| 2009/0212302 A1 * | 8/2009 | Lee et al. | ........................ | 257/79 |

FOREIGN PATENT DOCUMENTS

| | | |
|---|---|---|
| JP | 56-090525 A | 7/1981 |
| JP | 02-138456 A | 5/1990 |
| JP | 06-267888 A | 9/1994 |
| JP | 07-142479 A | 6/1995 |
| JP | 10-173049 A | 6/1998 |
| JP | 2000-503806 A | 3/2000 |
| JP | 2001-332664 A | 11/2001 |
| JP | 2003-152075 A | 5/2003 |
| JP | 2005-129886 A | 5/2005 |
| JP | 3804881 B2 | 8/2006 |
| JP | 2009-141230 A | 6/2009 |

* cited by examiner

*Primary Examiner* — Alexander Ghyka
*Assistant Examiner* — Stanetta Isaac
(74) *Attorney, Agent, or Firm* — Rossi, Kimms & McDowell LLP

(57) ABSTRACT

A method for manufacturing a semiconductor device is disclosed in which, after semiconductor function regions and patterns of interlayer insulating films including required contact holes are formed on one main surface side of a semiconductor substrate, an aluminum film or an aluminum alloy film which is thick is formed all over the main surface side of the semiconductor substrate and brought into conductive contact with the surface of the semiconductor substrate including bottom surfaces of the contact holes so as to form a required electrode film. Formation of the aluminum film or the aluminum alloy film is divided into a plurality of steps so that the thickness of the aluminum film or the aluminum alloy film is formed gradually, and between every two of the plurality of steps of forming the aluminum film or the aluminum alloy film, there is provided a step of performing isotropic etching to flatten irregularities in a surface of the aluminum film or the aluminum alloy film formed in the previous step. The method for manufacturing a semiconductor device prevents the formation of voids in the surface of an Al electrode film on the surface side of a semiconductor substrate.

12 Claims, 4 Drawing Sheets

METHOD FOR MANUFACTURING SEMICONDUCTOR DEVICE

BACKGROUND OF THE INVENTION

A. Field of the Invention

The present invention relates to a method for manufacturing a semiconductor device, and particularly relates to a semiconductor device manufacturing method concerned with improvement of a surface electrode film of a power semiconductor device for use in a power conversion apparatus or the like.

B. Description of the Related Art

In the background art, aluminum (hereinafter abbreviated to "Al") or Al-based alloys are often used as materials of electrode films and wires with which the surfaces of semiconductor substrates of power semiconductor devices are coated. This is because Al is a low-resistance material and can be easily processed into an electrode film shape and a wire shape. A sputtering method is often used as an Al film formation method. It is easy to control a composition for forming an Al film using a sputtering method, and this method also is superior in view of mass productivity because film thickness and film quality can be made uniform even in large-diameter semiconductor substrates.

On the other hand, in the surface of any of the aforementioned semiconductor substrates, a large number of irregularities are formed due to insulating film steps formed in boundaries between insulating films and electrode film contact portions in semiconductor function regions, hole-like wire contact portions provided in the insulating films, etc. Further, the Al film to be applied to the surface of the semiconductor substrate is required to be exactly applied to the irregular shapes of the insulating film steps, the holes and so on, and to be formed to contain as few voids as possible, in order to obtain electric properties and reliability thereof.

However, when the Al film is formed in this way on the surface of the semiconductor substrate having irregularities such as insulating film steps, in some aspect ratio the holes or the insulating film steps have, it is often a practical problem that step coverage may lead to disconnection, or in formation of voids even if disconnection can be avoided.

On the other hand, in recent years, power semiconductor devices have often been mounted on vehicles. As for the semiconductor devices to be mounted on vehicles, deterioration in their electric properties due to reduction in their reliability may lead to serious accidents. Therefore, the semiconductor devices are required to have extremely high reliability. The reliability of any semiconductor device is strongly linked to heating due to electricity applied thereto. In particular, current applied to a power semiconductor device is so high that the amount of heat generated is also high. A temperature rise exceeding a temperature rise expected in device design may lead to fatal deterioration of reliability in the semiconductor device. As a solution to this, a double-sided cooling structure instead of a conventional single-side cooling structure has been under review for power semiconductor devices to be mounted on vehicles, such as IGBTs (Insulated Gate Bipolar Transistors), in order to efficiently release heat generated by electricity applied thereto (JP-A-2001-332664 (Abstract, FIG. 1) or JP-A-2005-129886 (Abstract, FIG. 2)). This is because the single-sided cooling structure consisting of a surface side of Al wire connection and a back side of a heat sink cannot be expected to provide efficient heat radiation while the double-sided cooling structure releases heat from the both sides of a semiconductor substrate.

There is a document suggesting improvement of step coverage in such a manner that a metal layer is formed to cover edges of various step portions provided on a semiconductor substrate or acute edges appearing in free ends of holes provided likewise, and afterwards, the metal layer is made obtuse on each edge by dry etching using Ar sputtering and then coated with a conductive layer (JP-T-2000-503806 (FIG. 4)(The form "JP-T" as used herein means a published Japanese Translation of a PCT patent application)). In addition, there is a description that a surface etching step is provided to remove alumina from a surface before an aluminum electrode pattern is formed, and the surface is then patterned (JP-A-7-142479 (FIG. 3)). Further, there is a description that an aluminum-based alloy film must be modified, for example, by isotropic etching to provide a taper in the shape of any contact hole because step coverage over the contact hole is not good in the aluminum-based alloy film (JP-A-10-173049 (paragraph 0053)). Furthermore, there is also a description about a method in which a taper is formed in any contact hole by isotropic etching such as wet etching or plasma etching (JP-A-56-90525 (Detailed Description of the Invention)).

However, as shown in FIGS. 3A-3C, a well-known power semiconductor device such as a trench gate IGBT has semiconductor function regions which are formed on the surface of a silicon substrate 1 according to design conditions of the device and which include required trenches 2, p-type base regions 3, n+-type emitter regions 4, polysilicon gate electrodes 5, gate insulating films 6, interlayer insulating films 7 such as PSG films, contact holes 8 opened in the interlayer insulating films, etc. On the back side, the power semiconductor device has n+-type buffer layer 10, p-type collector layer 11 and collector electrode 12 as shown in FIG. 3C. Al electrode film 9a is applied all over the semiconductor function regions on the surface of the aforementioned silicon substrate 1 by a sputtering method. Thus, Al electrode film 9a is also applied in common onto the pattern of interlayer insulating films 7 on the surface of substrate 1. In the power semiconductor device, each interlayer insulating film 7 is applied thickly to be about 0.2 µm to 1.0 µm thick, and further Al electrode film 9a is also applied thickly to be about 0.5 µm to 5 µm thick. However, when the semiconductor substrate surface where contact holes or interlayer insulating film steps are formed as described above is coated with such a thick Al electrode film 9a, voids are often formed to be open in the surface of Al electrode film 9a. Particularly, as shown in FIG. 3B, such a void 9x is apt to be formed on a recess portion such as contact hole 8 or an insulating film step. The occurrence of void 9x is a problem peculiar to thick Al electrode film 9a. When a large number of voids 9x are formed thus in Al electrode film 9a, the conductivity to be expected as an electrode film deteriorates, leading to lowering in reliability as a uniform film. Further, as shown in FIGS. 4A and 4B, when a plurality of voids 9x are open in the surface of Al electrode film 9a, the voids are expanded as shown by reference numeral 9y in FIG. 4A or 9z in FIG. 4B due to permeation or survival of various treatment liquids or cleaning liquids used in a wafer process which is a post step so that there is problem in occurrence of secondary contamination.

In the double-sided cooling structure described in JP-A-2001-332664 (Abstract, FIG. 1) or JP-A-2005-129886 (Abstract, FIG. 2), a metal electrode plate which can serve as a heat sink is connected also onto a surface-side electrode film by soldering or the like. It is therefore necessary to laminate a solderable metal film such as nickel (Ni) film 13 further onto Al electrode film 9a as shown in FIG. 4B. In the step where nickel (Ni) film 13 is laminated onto Al electrode film 9a, voids open in the surface of Al electrode film 9a may be etched into more widely open voids. The voids cannot be fully filled with Ni particles entering the voids, but the voids may be deformed into the aforementioned voids 9z. Further, even if Al electrode film 9a is not judged as defective at that time, Al electrode film 9a may deteriorate and turn defective in a long-term reliability test.

SUMMARY OF THE INVENTION

The present invention was developed in consideration of the aforementioned problems. The invention provides a method for manufacturing a semiconductor device, by which it can be made difficult to form voids in the surface of an Al electrode film on the surface side of a semiconductor substrate.

Semiconductor function regions and insulating film patterns are formed on a main surface side of a semiconductor substrate. The insulating film patterns include required contact holes. An aluminum film or an aluminum alloy film is formed all over the main surface side of the semiconductor substrate, and brought into conductive contact with the semiconductor substrate surface including bottom surfaces of the contact holes. Thus, a required electrode film is formed. On this occasion, formation of the aluminum film or the aluminum alloy film is divided into a plurality of steps so that the thickness of the aluminum film or the aluminum alloy film is formed gradually. Between every two of the plurality of steps of forming the aluminum film or the aluminum alloy film, there is provided a step of performing isotropic etching to flatten irregularities in a surface of the aluminum film or the aluminum alloy film formed in the previous step.

The isotropic etching may be wet etching or dry etching using argon. An etched thickness in the flattening step may be made less than 0.5 µm.

The aluminum film or the aluminum alloy film may be in conductive contact with the semiconductor substrate surface including the bottom surfaces of the contact holes through a barrier metal film including laminated films of titanium and titanium nitride.

There may be further provided a step of forming a nickel film on a surface of the aluminum film or the aluminum alloy film.

According to the invention, it is possible to provide a method for manufacturing a semiconductor device, by which it can be made difficult to form voids in the surface of an Al or Al-based alloy electrode film on the surface side of a semiconductor substrate. The present invention is directed to overcoming or at least reducing the effects of one or more of the problems set forth above.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

A method for manufacturing a semiconductor device according to the invention will be described below in detail with reference to the drawings. The invention is not limited to the following description of its embodiment as long as the description of the invention does not depart from its gist.

First Embodiment

A first embodiment of the invention will be described below in detail with reference to the drawings. A method for manufacturing a semiconductor device according to the invention will be described with reference to a process for manufacturing a trench gate type IGBT (Insulated Gate Bipolar Transistor).

FIGS. 1A-1C and 2A-2C are main portion sectional views of a semiconductor substrate, which are arranged in manufacturing step order to explain the first embodiment according to the invention. Manufacturing processes around the step of forming an emitter electrode film by sputtering according to the invention are the same as those in a well-known manufacturing method, and description thereof will be made only briefly.

Figure 1A:
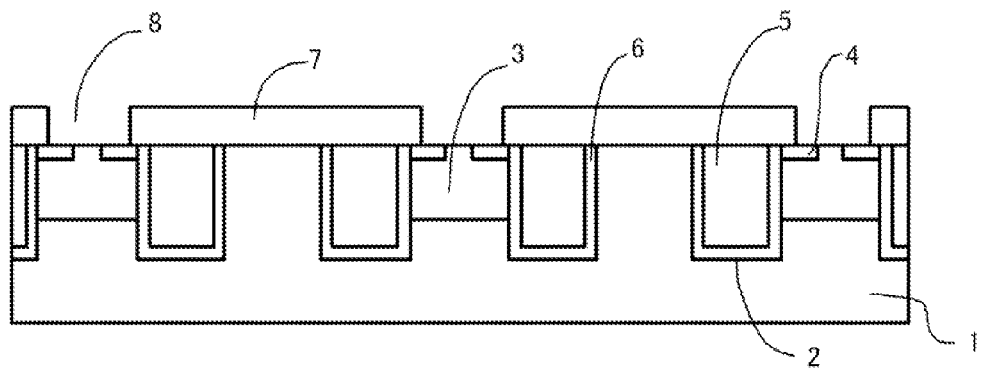
FIGS. 1A-1C are main portion sectional views (part I) of a semiconductor substrate, which are arranged in manufacturing step order for explaining a first embodiment according to the invention.

First, trenches 2, p-type base regions 3, $n^+$-type emitter regions 4, polysilicon gate electrodes 5, gate insulating films 6, interlayer insulating films 7 such as PSG films, contact holes 8 opened in the interlayer insulating films, etc. are formed on the main surface side of an FZ-n-type silicon substrate (hereinafter referred to as "wafer") 1 in required device design conditions by a well-known manufacturing method (FIG. 1A).

Figure 1B:
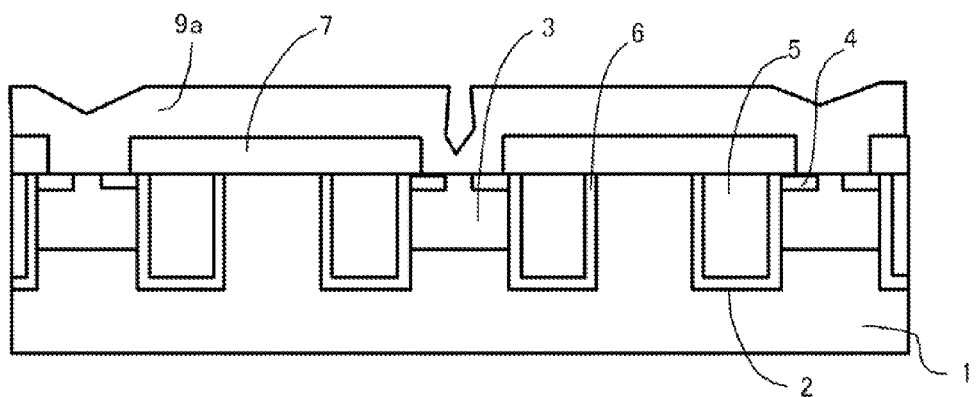

Next, as a barrier metal layer to ensure ohmic contact with predetermined surfaces of the semiconductor regions which include the p-type base regions 3 and $n^+$-type emitter regions 4 and which are opened in contact holes 8 in the wafer surface, a titanium nitride (TiN) layer of 70 nm thick is formed (not shown) on a titanium (Ti) layer of 30 nm thick by a not-shown sputtering apparatus. The barrier metal layer is coated with an Al-based alloy (hereinafter aluminum-silicon alloy, which will be abbreviated to "Al—Si") electrode film 9 with a total thickness of 3 µm or more by sputtering carried out a plurality of times. The electrode film is processed into a predetermined emitter electrode pattern shape by a dry etching method such as a reactive ion etching (RIE) method. Alternatively, the emitter electrode consisting of Al—Si electrode film 9 may be formed directly without performing the step of coating the barrier metal layer consisting of the Ti layer and the TiN layer (FIG. 1B).

Figure 1C:
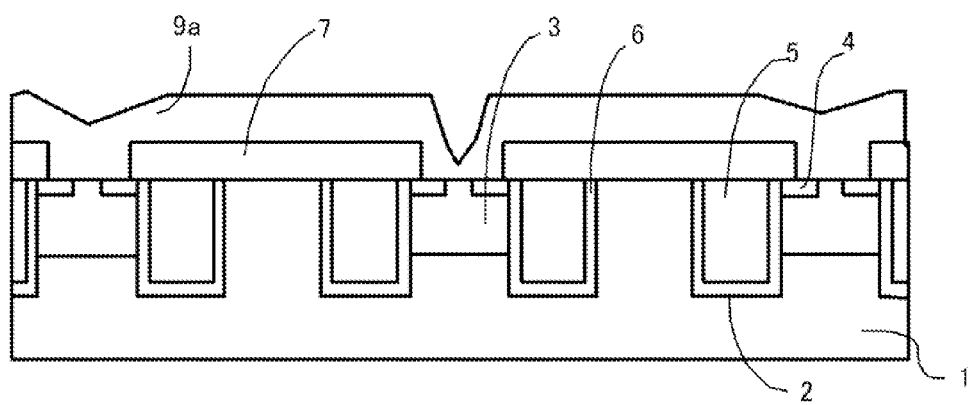
Figure 2A:
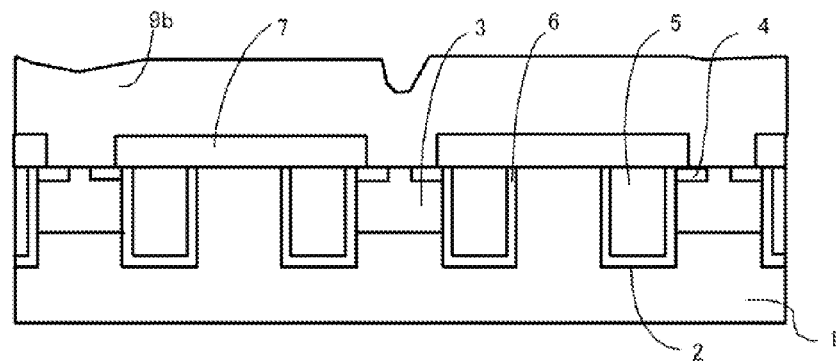
FIGS. 2A-2C are main portion sectional views (part II) of the semiconductor substrate, which are arranged in manufacturing step order for explaining the first embodiment according to the invention.
Figure 2B:
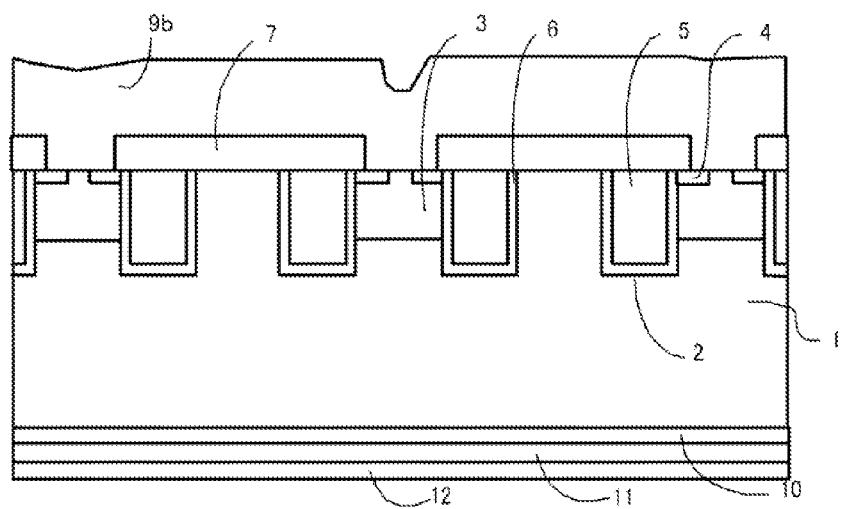
Figure 2C:
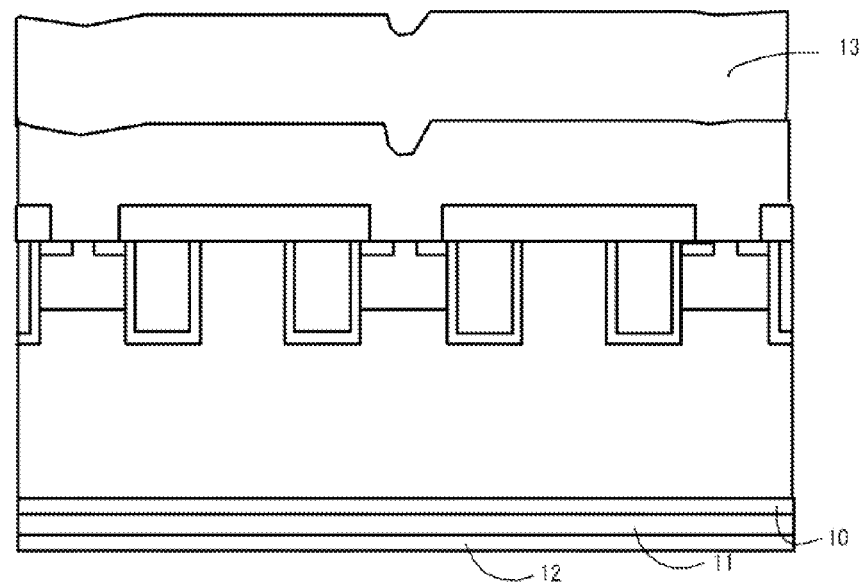
Figure 3A:
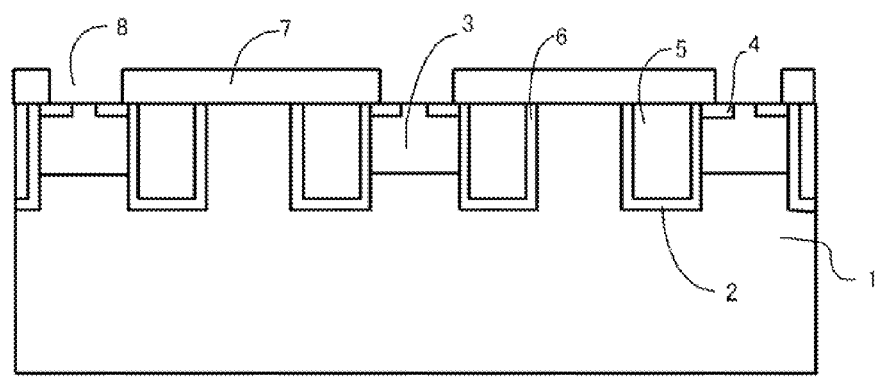
FIGS. 3A-3C are main portion sectional views (part I) of a semiconductor substrate, which are arranged in manufacturing step order for explaining a method for manufacturing a semiconductor device according to the background art.
Figure 3B:
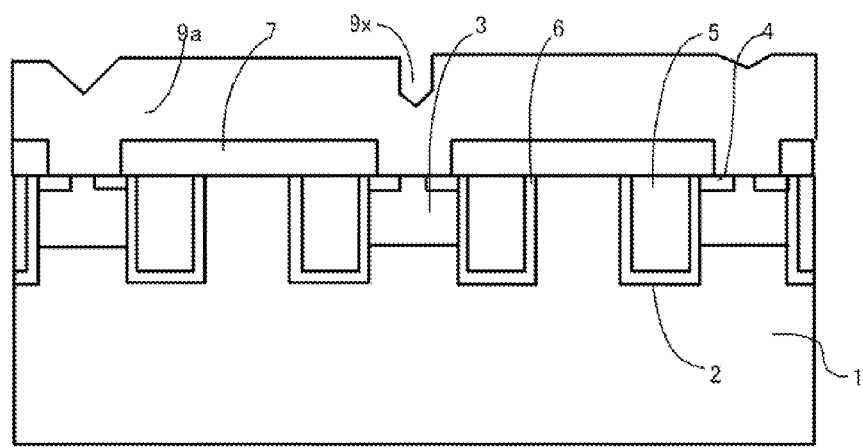
Figure 3C:
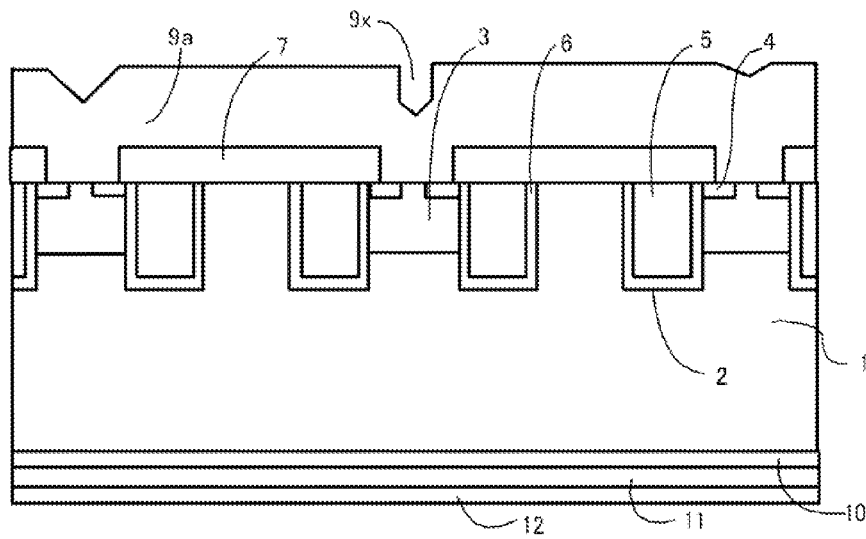
Figure 4A:
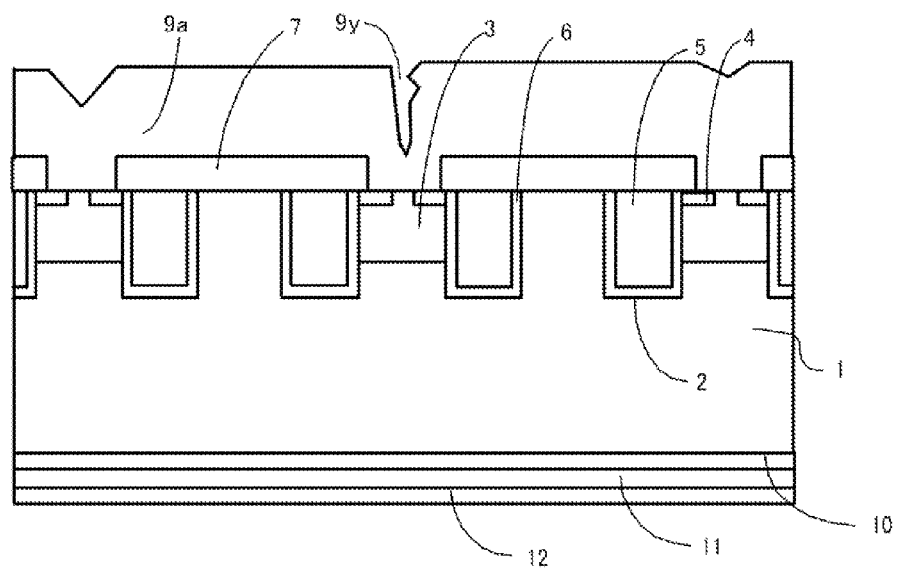
FIGS. 4A-4B are main portion sectional views (part II) of the semiconductor substrate, which are arranged in manufacturing step order for explaining the method for manufacturing a semiconductor device according to the background art.
Figure 4B:
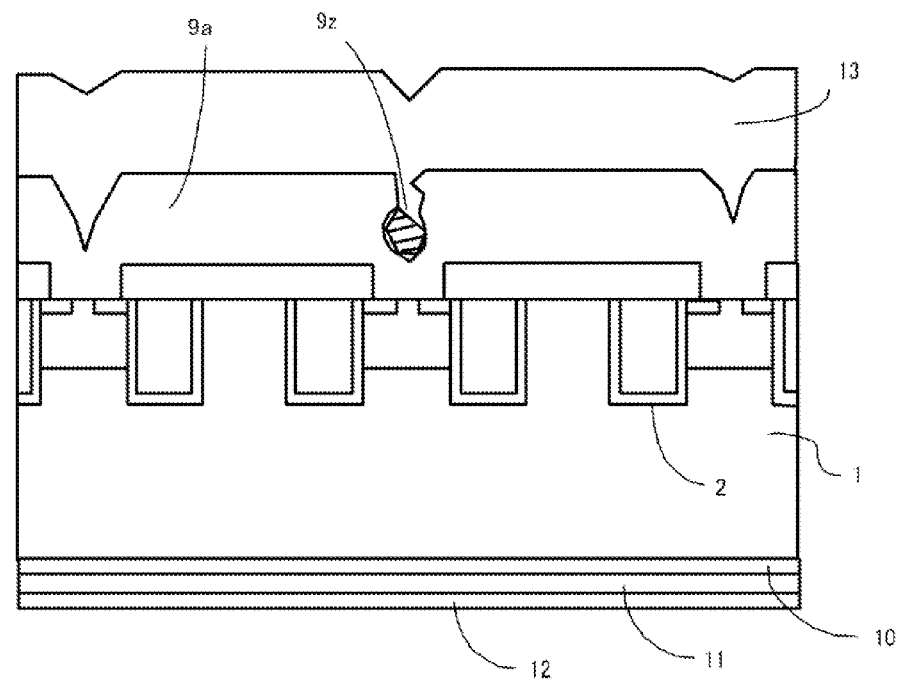

According to the invention, Al—Si electrode film 9 is formed in the thickness direction by several rounds of sputtering. First, Al—Si electrode film 9a is applied to be 2.5 µm thick on the whole surface of the wafer by the first round of sputtering. Next, of the surface of Al—Si electrode film 9a, a thickness less than 0.5 µm is etched by argon (Ar) sputtering before being processed into a predetermined emitter electrode pattern shape as described above. The argon (Ar) sputtering is performed with Ar gas supplied in a 0.2 Torr to 2.0 Torr (26.6 to 266 Pa) pressure atmosphere and at a rate of 100 sccm and with wafer-to-earth capacitance not higher than 200 pF. On this occasion, radio-frequency power is applied at a frequency of 13.56 MHz and at a density of 100 W/cm². Due to the application of the radio-frequency power, argon is excited into plasma to expedite argon (Ar) sputtering. As a result of the argon (Ar) sputtering, the inclination of a side wall of any recess portion is reduced in the surface of Al—Si electrode film 9a, and the opening diameter of the recess portion is increased. This phenomenon uses the characteristic of argon (Ar) sputtering by which a slope having an inclination angle of 45 degrees in a main surface of the wafer can be cut faster than a surface parallel to the main surface of the wafer (FIG. 1C). In each view that will be referred to the following, irregularities formed in the surface of Al—Si electrode film 9a are deformed and depicted to be comparatively large. Flattening the surface of the Al—Si electrode film by the argon (Ar) sputtering will be described more in detail.

In a not-shown sputtering apparatus, Ar gas is made to flow at a flow rate of 10 to 1,000 sccm, and adjusted and kept in a range of 0.1 to 100 Pa by a conductance valve or the like. RF power of 13.56 MHz, for example, adjusted in a range of 10 to 100 W/cm², is applied to a wafer placed in the apparatus so as to produce plasma discharge. Thus, the Al—Si electrode film 9a is irradiated with Ar ions with first ion energy. Assume that the wafer itself is not heated on this occasion.

Due to the irradiation with the Ar ions with first ion energy, Al—Si electrode film 9a formed on the wafer surface is etched by a thickness of 0.5 μm on average as a whole, but any inclined portion is etched more intensely than any flat portion.

Next, the wafer is vacuum-conveyed to a high vacuum treatment chamber. For example, the wafer is conveyed and fixed onto a ceramic heater heated to 200 to 500° C. in advance. The wafer may be fixed, for example, by an electrostatic chuck, and may be heated with gas such as Ar gas introduced to the wafer back side in order to increase the thermal conduction efficiency.

Next, Ar gas is made to flow at a flow rate of 10 to 1,000 sccm, and adjusted and kept in a range of 0.1 to 100 Pa by a conductance valve or the like. RF power of 13.56 MHz, for example, adjusted in a range of 1 to 10 W/cm², is applied to the substrate so as to produce plasma discharge. Thus, Al—Si electrode film 9a is irradiated with Ar ions with second ion energy. The ultimate vacuum of the treatment chamber is set as a high vacuum of $10^{-6}$ Pa or higher. Here, the second ion energy is selected to be a smaller value than the first ion energy so that the surface of Al—Si electrode film 9a will be hardly etched by the irradiation with the ions with the second ion energy.

Due to the irradiation with the charged particles with the second ion energy, the surface diffusion of Al atoms in the surface of Al—Si electrode film 9a is accelerated by the Ar ions colliding therewith even when the wafer heating temperature is low. Thus, the surface-diffused Al atoms move into recess portions so as to reduce the surface free energy, and serves to fill the recess portions with the Al—Si electrode film.

Next, in the same conditions as the aforementioned Al—Si electrode film 9a formed by the first round of sputtering, Al—Si electrode film 9b which is 2.5 μm thick in the second round is deposited to lie on the surface of Al—Si electrode film 9a in the first round. The surface of Al—Si electrode film 9b in the second round is etched by about 0.5 μm by dry etching using Ar sputtering in the same manner as described above. Thus, the surface of Al—Si electrode film 9b in the second round is flattened. Such a process is repeated a required number of times to form Al—Si electrode film 9 with a required film thickness. As a result, occurrence of voids could not be found even if the thickness of Al—Si electrode film 9 was increased to 1 μm to 5 μm. Preferably the thickness of the Al—Si electrode film formed at one time is set to be 0.5 μm or more. If the thickness of the film formed at one time is made too thin, the working efficiency will deteriorate. Therefore, the thickness of the film formed at one time may be decided in consideration of both the working efficiency and the required thickness of the electrode film.

Further, after the surface of Al—Si electrode film 9b with a required thickness is dry-etched by Ar sputtering as described above, an Ni film may be further laminated thereto by a well-known sputtering method or plating so that an electrode plate to be connected externally can be bonded thereto by soldering.

In addition, as described above, the dry etching using Ar sputtering may be replaced by a surface etching process with a mixed acid of phosphoric acid, nitric acid and acetic acid at a ratio of 10:1:1 in volume percentages at a liquid temperature of 60° C. and for an etching time of 5 minutes. After the etching, the surface of Al—Si electrode film 9a, 9b may be flattened by a method of rinsing for 40 minutes.

After that, n⁺-type buffer layer 10, p-type collector layer 11 and back-side collector electrode 12 are formed on the back side of the wafer in the same manner as in the background-art manufacturing method.

Although an IGBT was described as a semiconductor device in the first embodiment, the invention may be applied to an Al—Si electrode film on the surface side of a semiconductor device such as a power MOSFET or a power diode other than the IGBT.

Thus, a semiconductor device and method manufacturing the same have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2009-145552, filed on Jun. 18, 2009. The disclosure of the priority application in its entirety, including the drawings, claims, and the specification thereof, is incorporated herein by reference.

What is claimed is:

1. A method for manufacturing a semiconductor device, comprising the steps of:
    forming semiconductor function regions and insulating film patterns on a main surface side of a semiconductor substrate, the insulating film patterns including required contact holes; and
    forming an aluminum film or an aluminum alloy film with a film thickness of 0.5 μm or more all over the main surface side of the semiconductor substrate, and bringing the aluminum film or the aluminum alloy film into conductive contact with the semiconductor substrate surface including bottom surfaces of the contact holes so as to form an electrode film; wherein:
    the step of forming the aluminum film or the aluminum alloy film is divided into a plurality of steps to form the thickness of the aluminum film or the aluminum alloy film gradually; and
    after each step of forming the aluminum film or the aluminum alloy film, there is a step of performing isotropic etching to flatten irregularities in a surface of the aluminum film or the aluminum alloy film.

2. A method for manufacturing a semiconductor device according to claim 1, wherein the isotropic etching is wet etching or dry etching using argon.

3. A method for manufacturing a semiconductor device according to claim 2, wherein an etched thickness in the flattening step is less than 0.5 µm.

4. A method for manufacturing a semiconductor device according to claim 3, wherein the aluminum film or the aluminum alloy film is in conductive contact with the semiconductor substrate surface including the bottom surfaces of the contact holes through a barrier metal film including laminated films of Ti and TiN.

5. A method for manufacturing a semiconductor device according to claim 2, wherein the aluminum film or the aluminum alloy film is in conductive contact with the semiconductor substrate surface including the bottom surfaces of the contact holes through a barrier metal film including laminated films of Ti and TiN.

6. A method for manufacturing a semiconductor device according to claim 2, further comprising the step of:
forming a nickel film on a surface of the aluminum film or the aluminum alloy film.

7. A method for manufacturing a semiconductor device according to claim 1, wherein an etched thickness in the flattening step is less than 0.5 µm.

8. A method for manufacturing a semiconductor device according to claim 7, wherein the aluminum film or the aluminum alloy film is in conductive contact with the semiconductor substrate surface including the bottom surfaces of the contact holes through a barrier metal film including laminated films of Ti and TiN.

9. A method for manufacturing a semiconductor device according to claim 7, further comprising the step of:
forming a nickel film on a surface of the aluminum film or the aluminum alloy film.

10. A method for manufacturing a semiconductor device according to claim 1, wherein the aluminum film or the aluminum alloy film is in conductive contact with the semiconductor substrate surface including the bottom surfaces of the contact holes through a barrier metal film including laminated films of Ti and TiN.

11. A method for manufacturing a semiconductor device according to claim 10, further comprising the step of:
forming a nickel film on a surface of the aluminum film or the aluminum alloy film.

12. A method for manufacturing a semiconductor device according to claim 1, further comprising the step of:
forming a nickel film on a surface of the aluminum film or the aluminum alloy film.

* * * * *